US008088563B2

(12) United States Patent
Ahn et al.

(10) Patent No.: US 8,088,563 B2
(45) Date of Patent: Jan. 3, 2012

(54) REDUCTION IN PHOTORESIST FOOTING UNDERCUT DURING DEVELOPMENT OF FEATURE SIZES OF 120NM OR LESS

(75) Inventors: Sang H. Ahn, Foster City, CA (US); Sudha Rathi, San Jose, CA (US); Heraldo L. Bothelho, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 333 days.

(21) Appl. No.: 11/603,698

(22) Filed: Nov. 21, 2006

(65) Prior Publication Data

US 2007/0154851 A1 Jul. 5, 2007

Related U.S. Application Data

(62) Division of application No. 10/724,454, filed on Nov. 28, 2003, now abandoned.

(51) Int. Cl.
G03F 7/30 (2006.01)
H05H 1/30 (2006.01)
(52) U.S. Cl. ........ 430/322; 430/325; 430/464; 427/569; 427/578
(58) Field of Classification Search .................. None
See application file for complete search history.

(56) References Cited

U.S. PATENT DOCUMENTS

| | | | |
|---|---|---|---|
| 5,789,040 A * | 8/1998 | Martinu et al. | 427/575 |
| 6,171,764 B1 | 1/2001 | Ku et al. | 430/322 |
| 6,227,141 B1 | 5/2001 | Sharan et al. | 118/723 |
| 6,607,984 B1 | 8/2003 | Lee et al. | 438/700 |
| 6,638,684 B2 * | 10/2003 | Okubo et al. | 430/270.1 |
| 6,645,702 B1 * | 11/2003 | Rangarajan et al. | 430/313 |
| 6,927,178 B2 * | 8/2005 | Kim et al. | 438/778 |
| 7,064,080 B2 * | 6/2006 | Gilton et al. | 438/736 |
| 7,105,460 B2 * | 9/2006 | Kim et al. | 438/778 |
| 2003/0087518 A1 | 5/2003 | Chen et al. | 438/637 |
| 2004/0052948 A1 * | 3/2004 | Gronbeck et al. | 427/299 |

FOREIGN PATENT DOCUMENTS

EP 1011135 A2 6/2000

OTHER PUBLICATIONS

J.E. Klemberg-Sapieha, et al., "Dual Microwave—R.F. Plasma Deposition of Functional Coatings", *Thin Solid Films*, vol. 193/194, pp. 965-972 (1990).
A. Raveh, et al., "Deposition and Properties of Diamondlike Carbon Films Produced in Microwave and Radio-Frequency Plasma", *J. Vac. Sci. Technol. A.*, vol. 10, No. 4, pp. 1723-1727 (1992).

* cited by examiner

*Primary Examiner* — Daborah Chacko Davis
(74) *Attorney, Agent, or Firm* — Shirley L. Church, Esq.

(57) ABSTRACT

We have traced the detachment of photoresist during development of patterned features in the range of about 90 nm and smaller to a combination of the reduced "foot print" of the pattern on the underlying substrate and to the contact angle between the underlying substrate surface and the developing reagent. By maintaining a contact angle of about 30 degrees or greater, the detachment of the photoresist from the underlying substrate can be avoided for photoresists including feature sizes in the range of about 90 nm. We have achieved an increased contact angle between the DARC surface and a water-based CAR photoresist developer while simultaneously reducing CAR poisoning by treating the surface of the DARC after film formation.

27 Claims, 7 Drawing Sheets

REDUCTION IN PHOTORESIST FOOTING UNDERCUT DURING DEVELOPMENT OF FEATURE SIZES OF 120NM OR LESS

This application is a divisional application of U.S. application Ser. No. 10/724,454, filed Nov. 28, 2003, and entitled: "Maintenance of Photoresist Adhesion and Activity on the Surface of Dielectric Arcs for 90 nm Feature Sizes", which has gone abandoned.

BACKGROUND OF THE INVENTION

1. Field of the Invention

The present invention relates to the fabrication of semiconductor devices having feature sizes in the range of 90 nm and smaller. In particular, the invention relates to a method of maintaining the adhesion of a photoresist to a surface during development of a pattern in the photoresist and to maintenance of the functionality of a chemically amplified photoresist on the surface of a dielectric anti-reflection coating (DARC).

2. Description of the Background Art

As semiconductor devices are becoming ever smaller, the device features necessarily become smaller. To produce feature sizes in the range of about 124 nm, for example, a chemically amplified photoresist (CAR) is pattern imaged using a DUV wavelength in the range of about 248 nm. To produce the next generation of feature sizes, in the range of 90 nm, the CAR will be pattern imaged using a radiation wavelength in the range of about 193-198 nm. The chemically amplified photoresists are typically deposited over the surface of a DARC which reduces reflection during pattern radiation imaging of the CAR. The composition of the DARC is determined by the refractive index and extinction coefficient required to attenuate the radiation reflected off the surface of the device substrate which underlies the DARC.

The DARC used in combination with the CAR deep UV (DUV) photoresists are frequently deposited by plasma enhanced chemical vapor deposition (PECVD). A number of techniques have been described for deposition of PECVD films. In general, the deposition techniques are closely tied to the apparatus used for the deposition, although some parameters such as process chamber pressure, substrate temperature and composition of the source gas used to provide the reactive species are relatively independent of the apparatus peculiarities.

In an article entitled "Dual Microwave—R.F. Plasma Deposition Of Functional Coatings" by J. E. Klemberg-Sapieha et al. in Thin Solid Films, 193/194 (1990) 965-972, the authors described the deposition of plasma silicon nitride (P-SiN) and amorphous hydrogenated silicon (a-Si:H) films using a dual-frequency plasma. The power source for the plasma consisted of a microwave discharge with RF power simultaneously superimposed on the substrate holder. The negative substrate bias voltage was said to substantially affect the deposition rate, the film composition, and the film electrical properties. The authors report that ionic species are estimated to contribute about 30% to 40% to the film growth rate. The increasing ion flux and energy with increasing substrate bias voltage is said to enhance the formation of densely packed coatings. As a result, the dielectric los tan $\delta$ of P-SiN, and the resistivity of a-Si:H is said to be reduced by several orders of magnitude when the substrate bias voltage is raised from 0 to −800V. The depositions were carried out in a large volume microwave plasma (LMP®) apparatus of the kind available from AIXTRON AG and Fraunhofer IAF, Freiburg, Germany, with a MW power at 2.45 GHz applied through a fused silica window from a periodic slow wave structure. The substrate bias was applied at a frequency of 13.56 MHz to a powered electrode which functioned as the substrate holder.

A. Raveh et al. discuss the "Deposition and properties of diamond like carbon films produced in microwave and radio-frequency plasma" in an article in J. Vac. Sci. Technol. A 10(4), July/August 1992. In that article the authors report that hard a-C:H films were grown in a dual frequency plasma sustained simultaneously by microwave and radio-frequency power. Optimum growth conditions, namely those leading to the most pronounced $sp^3$ structural features in the films, are said to depend very strongly on the methane feed gas flow rate and on the argon concentration in the case of $CH_4$/Ar feed gas mixtures. The optimum conditions are reported to be found to correspond to the maximum values of ion flux at the growing film surface in combination with high concentrations of precursor species such as CH, C2, C3, and atomic hydrogen in the plasma, as revealed by optical emission spectroscopy. Films grown under optimum conditions are said to have very high microhardness (~50 GPa), high density (1.8 g/cm$^3$), and low internal stress (0.5 GPa). Addition of argon to the methane in the feed gas is indicated as enhancing the gas phase fragmentation and raising microhardness, but argon atoms trapped in the film structure increased internal stress. The apparatus which was used to produce the films was the same apparatus as described above.

International Application No. PCT/US00/20383, of Gill Yong Lee, published Feb. 8, 2001, discloses the use of a silicon-rich layer over the surface of a dielectric ARC to prevent "resist poisoning". In particular, the DARC described is an inorganic ARC layer such as silicon nitride ($Si_xN_y$) or silicon oxynitride ($SiN_xO_y$), or hydrogenated silicon oxynitride. The DARC is said to be particularly useful during pattern imaging of the photoresist, typically a CAR which relies on an acid formed in irradiated areas to enable development of the pattern. However, the presence of amine radicles which are contributed by the DARC contaminates the CAR applied over the DARC, neutralizing the acid-generators. This makes the contaminated portions of the resist insoluble by the developer. As a result, a "foot" is present at the base of the developed resist profile. To prevent this problem, a capping layer is applied over the DARC prior to application of the CAR. In one embodiment, the capping layer is silicon, preferably a thin amorphous silicon layer. The silicon layer is said to be sufficiently thin to avoid causing standing waves and interference in the resist. Alternatively, the cap layer may be a mono-atomic layer that alters the surface morphology of the DARC. The mono-atomic layer, in one embodiment comprises excess silicon dangling bonds on the surface of the DARC. For example, the cap layer could comprise a silicon-rich oxide or a silicon-rich oxynitride if the DARC comprised silicon oxide or an oxynitride layer.

U.S. Pat. No. 6,227,141 of Sharan et al., issued May 8, 2001, describes an RF powered, plasma enhanced chemical vapor deposition reactor and methods of use of the reactor. The plasma enhanced chemical vapor deposition (PECVD) apparatus makes use of a first RF power source which delivers RF power at a first frequency to a first electrode, and a second RF power source which delivers RF power at a second frequency to a second electrode.

Applied Materials, Inc., Santa Clara, Calif. offers both single and dual frequency PECVD chambers. The multifrequency processing chambers typically apply two different RF power frequencies to a single electrode.

U.S. Pat. No. 6,171,764 to Ku et al., issued Jan. 9, 2001, describes the kinds of radiation reflection problems which may occur in photolithographic processes. The description relates to semiconductor manufacturing processes which make use of a dielectric anti-reflective (DARC) layer to reduce reflected radiation during photoresist imaging. In particular, the difference between the Ku et al. invention and other known methods is based on the ordering of specific layers in the substrate used in the photolithographic process. In the Ku et al. method, the DARC layer is applied over a substrate, followed by a hard mask layer, and then a photoresist. This is said to compare with other known methods where the DARC layer is used between the photoresist layer and the hard mask layer. (Col. 3, lines 35-46.)

U.S. Pat. No. 6,607,984 to Lee et al., issued Aug. 19, 2003 describes a method of semiconductor fabrication in which an inorganic anti-reflection coating is employed and subsequently removed by selective etching relative to an underlying inorganic dielectric layer. (Col. 1, lines 61-67, continuing at Col. 2 lines 1-6.)

European Patent Application No. 99204265.5 of Shao-Wen Hsia et al., published Jun. 21, 2000, describes a semiconductor interconnect structure employing an inorganic dielectric layer produced by plasma enhanced chemical vapor deposition (pecvd). In accordance with a preferred embodiment of the invention, a metal layer upon which photoresist patterns are developed comprises a sandwiched metal stack having a layer of conducting metal (aluminum, titanium, and the like) bounded by an upper thin-film ARC layer and a bottom thin-film barrier layer, where at least the top layer is composed of an inorganic dielectric substance. The use of an inorganic dielectric top ARC layer is said to facilitate the use of thinner photoresist layers while preserving the integrity of the photoresist pattern for deep sub-micron feature sizes. (Col. 1, lines 56-58, continuing at Col. 2, lines 1-8.)

We have encountered a problem which does not appear to be addressed in the known art, but which has become important in particular with respect to semiconductor substrate features in the 90 nm range and smaller. During development of the photoresist, applicants have encountered instances where the photoresist becomes detached from the underlying substrate. Development refers to treatment of the photoresist with a fluid, typically a liquid reagent, to remove portions of the photoresist, thus creating a pattern. For reference purposes, when the portions of the photoresist which are removed are the portions which have been exposed to patterning radiation, the photoresist is said to be a positive photoresist. When the portions of the photoresist which are removed are the portions which have not been exposed to patterning radiation, the photoresist is said to be a negative photoresist.

In addition to detachment of areas of the photoresist from the underlying substrate, we have continued to observe reaction at the interface between an underlying DARC and the photoresist. This reaction is despite the use of a nitrogen-free DARC. It is possible to use a capping layer of the kind described in the art to isolate the photoresist from an underlying DARC. However, typically the semiconductor manufacturing process is a dual damascene process, which is common in multilevel metal devices. In a dual damascene process, after the first photoresist patterning process, there is an etch through underlying layers, including the DARC using the photoresist as a pattern. Subsequently, the portions of the opened pattern are filled with a buried ARC (BARC), followed by application of a second layer of photoresist and creation of a second pattern in the photoresist. Typically the second layer of photoresist is in contact with the DARC at the surface area where the etch passed through the DARC. Thus, there are still significant photoresist "poisoning" problems even when a capping layer is applied over the upper surface of the DARC as a part of the preparation for the first patterning step.

A need exists for ensuring photoresist adhesion and uniform lithographic imaging and development activity on the surface of various underlying substrates (particularly on the surface of dielectric arcs) during the fabrication of semiconductor devices with feature sizes of 90 nm and smaller.

SUMMARY OF THE INVENTION

We have traced the detachment of photoresist during development of patterned features in the range of about 90 nm and smaller to a combination of the reduced "foot print" of the pattern on the underlying substrate and to the contact angle between the underlying substrate surface and the developing reagent used to develop a pattern in the photoresist. We have determined that by maintaining a contact angle of about 20 degrees or greater, and preferably 35 degrees or greater, the detachment of the photoresist from the underlying substrate can be avoided for photoresists including feature sizes in the range of about 90 nm. As feature sizes grow even smaller, it may be necessary to continually increase the contact angle to maintain adhesion of the photoresist to the underlying substrate during development of the photoresist. The key is to reduce the force exerted against the photoresist wall as the feature size becomes smaller, with the concurrent reduction in foot print of the photoresist on the underlying substrate surface.

The contact or wetting angle of the substrate depends on the composition of both the substrate and the developer used for photoresist development. The embodiments described below pertain to a DARC, and in particular a DARC comprised of $SiO_xH_y$:C, where x ranges from greater than 1 to about 2.0, and H ranges from about 0.1 to about 0.3, and the carbon content ranges from 0% up to 5.0% (typically less than about 3.0%). The reagents used to produce the DARC by PECVD are typically $SiH_4$, and $CO_2$, with helium added as a diluent plasma source gas, which also provides species for surface bombardment of the depositing film. For a silane-based PECVD film deposition process, where the silicon-containing precursor is $SiH_4$, the carbon content in the polymeric film structure is typically less than about 3%, which is contributed by $CO_2$ used in the firm formation process. We have discovered that an increase in carbon content of the DARC produces a higher contact angle, which is beneficial in terms of reducing the potential for detachment of the photoresist from the DARC surface during development of the photoresist using a water based developer of the kind commonly used in the semiconductor industry. To achieve a higher carbon content in the DARC, the amount of $CO_2$ used in the $SiH_4/CO_2$ process may be increased to some extent; in an alternative, the silane-based precursor used in the PECVD deposition of the DARC may contain carbon, such as trimethyl silane (($CH_3)_3HSi$) or tetramethyl silane (($CH_3)_4Si$), for example, but not by way of limitation.

Other Group IV elements such as silicon, germanium, tin and lead, by way of example and not by way of limitation, which are present in the DARC film may be increased in concentration, in a manner similar to the carbon content, to increase the contact angle between the DARC surface and the fluid photoresist developer.

While an increased carbon content in the DARC increases the contact angle and has a beneficial effect in terms of reducing photoresist detachment from the DARC surface during development, a higher carbon content in a silane precursor for PECVD film formation is generally more expensive and carbon particulate byproducts of the film deposition may require more frequent deposition process chamber cleaning. The improved attachment of the photoresist during development may justify the increased chamber maintenance costs in terms of throughput in some instances. As an alternative, it is possible to use a lower carbon content DARC, but to use a surface treatment of the DARC to increase the contact angle with the developer; or to use a developer which provides a higher contact angle on the DARC surface.

We have achieved an increased contact angle between the DARC surface and a water-based, basic CAR photoresist developer by treating the surface of the DARC after formation of the DARC film. In particular, the DARC film surface has been treated with a hydrogen plasma or a helium plasma to provide an increase in the contact angle. Preferably, the hydrogen plasma is used for the DARC film surface treatment, as this process provides a greater shelf life for the DARC coated substrate prior to subsequent use and provides very good uniformity of performance across the entire substrate.

The most commonly used DUV photoresists for semiconductor device manufacture are the positive chemically amplified photoresists (CARs), which rely upon the generation of an acid in the irradiated portion of the photoresist to form a latent image which is subsequently developed using a basic developer. The photoresist pattern developer is commonly a basic, water-based developer. The presence of a base on the surface of a DARC at the time the CAR is applied causes subsequent problems in pattern production, because the acid generated in the CAR upon irradiation reacts with the base on the surface of the DARC, producing areas at the interface of the DARC and the CAR which do not contain the acid generated by the irradiation. Development of the photoresist pattern at this interfacial area does not occur properly when the basic developing agent is applied to the photoresist. We have discovered that it is not enough to remove nitrogen-containing species from the surface of the DARC. It is also necessary to reduce the presence of OH groups from the surface of the DARC. The treatment of the DARC surface with a hydrogen plasma prior to photoresist application to the DARC surface not only increases the contact angle between the DARC and a water-based photoresist developer, it also reduces the available OH groups on the surface of the DARC, reducing photoresist poisoning during deposition, and pattern latent image formation of the photoresist. Treatment of the DARC surface with helium prior to photoresist application also tends to reduce the available OH groups on the surface of the DARC, but has a limited performance time window, and has been less uniform in ability to reduce photoresist poisoning under currently known treatment conditions.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

As mentioned above, we have traced the detachment of photoresist during development of patterned features in the range of about 90 nm and smaller to a combination of the reduced "foot print" of the pattern on the underlying substrate and to the contact angle between the underlying substrate surface and the developing reagent. We have determined that by maintaining a contact angle of about 20 degrees or greater, preferably 35 degrees or greater, the detachment of the photoresist from the underlying substrate can be avoided for photoresists including feature sizes in the range of about 90 nm or smaller.

Figure 1A:
FIG. 1A shows a diagram 100 of a liquid droplet 102 in contact with a substrate 103, where the contact angle 104, referred to as $\alpha_1$, in the range of about 18 degrees.

FIG. 1A is a simple diagram showing a top view of a substrate surface 103 with a liquid droplet 102 on the surface 103. The contact angle between the surface 103 and droplet 102 is the angle between the horizontal substrate surface and a tangent drawn along the curvature of the droplet 102 at the edge of droplet 102. The contact angle can approach zero degrees when the droplet 102 wets surface 103 well and the tangent line is nearly flat. In FIG. 1A, the contact angle 102, referenced as $\alpha_1$, is illustrated as being about 18 degrees. This contact angle is just slightly below the minimum contact angle we have determined to be adequate to protect a photoresist having 90 nm feature sizes against detachment from an underlying surface during development of a latent irradiated image in the photoresist (into a patterning mask having the 90 nm features).

Figure 1B:
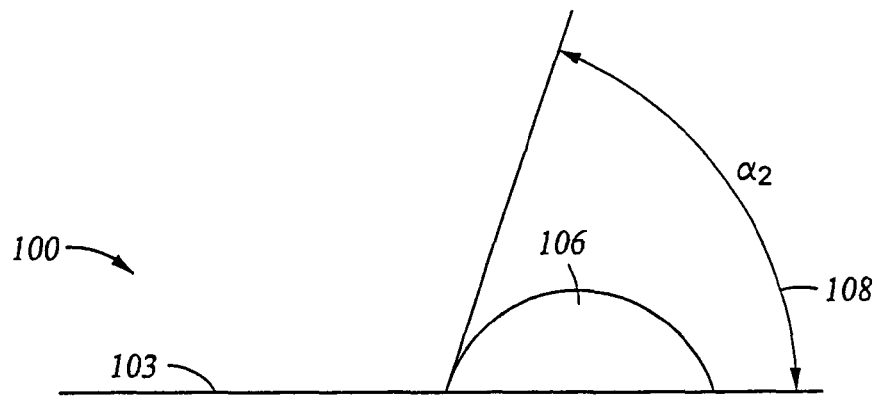
FIG. 1B shows a diagram 100 of a liquid droplet 106 in contact with a substrate 103, where the contact angle 108, referred to as $\alpha_2$, is in an acceptable range, about 70 degrees, for the present invention.
Figure 1C:
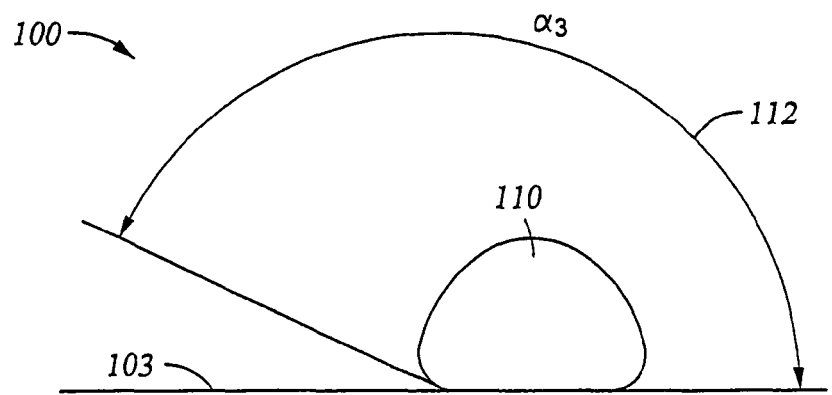
FIG. 1C shows a diagram 100 of a liquid droplet 110 in contact with a substrate 103, where the contact angle 112, referred to as $\alpha_3$, is in an acceptable range, about 155 degrees, for the present invention

FIG. 1B shows another droplet 106 of a material which forms a contact angle 108, referenced as $\alpha_2$, with substrate 103. The contact angle in FIG. 1B is illustrated as being about 70 degrees, well above the minimum contact angle of about 20 degrees which is recommended to prevent photoresist detachment for 90 nm photoresist features.

The basic concept of the present invention with respect to the affect of contact angle on adhesion of photoresist to an underlying substrate during development of the photoresist is applicable to any underlying substrate and the developing fluid used to develop the photoresist. For purposes of illustration, the experimental embodiments described were carried out using DARC® (Applied Materials, Inc.) 193 substrates. In some instances, the surfaces of the DARC® 193 substrate was surface treated prior to application of the photoresist. The initial adhesion studies were carried out on DARC® 193 substrates where the photoresist applied over the substrate and developed into a pattern was a developer used during the initial adhesion study was a SHIPLEY® UV6 (248 nm) CAR. The developer used to develop the UV6 CAR was a tetramethylammonium hydroxide (TMAH)-containing aqueous alkaline solution, with the specific formulation being that recommended by Shipley Company, Marlborough, Mass., for developing the Shipley UV6 CAR. Subsequent to the initial studies, additional experimentation has been carried out in which a JSR AT237 CAR (193 nm) photoresist was used for purposes of evaluating the effect of photoresist adhesion and poisoning effects with respect to 90 nm pattern feature sizes.

The initial adhesion studies, which used the SHIPLEY® UV 6 photoresist employed a photoresist thickness in the range of about 3,000 Å to about 4,000 Å. The patterning of the photoresist was carried out using a CANON® FPA-5000ES2 exposure tool which provided 248 nm radiation. The target feature was a 100 nm line/120 nm space. The reticle was a SCAA mask. An HMDS treatment was carried out on the DARC substrate for 30 seconds prior to photoresist application. The development of the photoresist was carried out for 60 seconds under conditions recommended for the SHIPLEY® UV6 photoresist.

A typical experimental substrate included, from bottom to top, a silicon substrate; a 600 Å thick layer of α-carbon; a 250 Å thick layer of DARC or DARC 193; a treated surface on the DARC or DARC 193, or a capping layer over the DARC or DARC 193 surface; and an approximately 3,200 Å thick layer of the Shipley UV 6 CAR.

The DARC and DARC 193 anti-reflective coatings which were used in the experimental embodiments were applied using PECVD in an Applied Materials, Inc. PRODUCER® system in a twin PECVD processing chamber. Applied Materials, Inc. has offices in Santa Clara, Calif. The comparative example DARC film was a standard $SiO_xN_y$, where x was approximately 1.25 and y was approximately 0.25.

The DARC 193 was a nitrogen-free $SiO_xH_y$:C film, where x ranged from greater than 1 to about 2.0, and y ranged from about 0.1 to about 0.3, with a carbon content ranging from about 0% to 5%, and typically in the range of about 3%, unless specified to be different. The precursors used to produce the DARC 193 film were silane ($SiH_4$), $CO_2$, and helium. An additional nitrogen-free DARC 193 film was made to achieve increased carbon content in the film, where the precursor silane was trimethyl silane $(CH_3)_3HSi$. However, one skilled in the art will understand that other carbon-containing silanes could be substituted as precursor materials for deposition of the DARC by PECVD techniques known in the art.

As previously mentioned, although an increased carbon content in the DARC increases the contact angle and has a beneficial effect in terms of reducing photoresist detachment from the DARC or DARC 193 surface during development, the higher carbon content silane precursors for PECVD film formation are more expensive and require more frequent process chamber cleaning. The improved attachment of the photoresist during development may justify the increased chamber maintenance costs in terms of throughput in some instances. Other Group IV elements such as (an increased amount of) silicon, or germanium, or tin, or lead, for example and not by way of limitation, may be incorporated into a DARC or DARC 193 film to increase the contact angle. One skilled in the art can determine with minimal experimentation the amount of the Group IV element which must be included to obtain a contact angle which is adequate, in view of the present disclosure.

As an alternative to inclusion of a Group IV element other than silicon, or to increasing the silicon content in the DARC or DARC 193 film, it is possible to use a surface treatment of the DARC to reduce the contact angle with the developer; or to use a developer which provides a higher contact angle on the DARC surface.

production of the $SiO_xH_y$:C films in the PRODUCERS twin PECVD process chamber. The application of dual frequency power sources during deposition of the DARC 193 $SiO_xH_y$:C films has proved to reduce photoresist poisoning, increase the shelf life of the DARC 193 coated substrate prior to photoresist application, and has improved maintenance of refractive index and extinction coefficient of the DARC 193 film during oxygen plasma ashing for removal of residual photoresist, as will be discussed in more detail subsequently herein.

TABLE I

MULTIPLE FREQUENCY DARC 193 FILM DEPOSITION PROCESS AND DATA

| $SiH_4$ (sccm) | $CO_2$ (slm) | He (slm) | Pressure (Torr) | HF (Watts) | LF (Watts) | Thickness (Å) | n (193 nm) | k @ 150 Å | k @ 250 Å | Stress (Mpa) |
|---|---|---|---|---|---|---|---|---|---|---|
| 40 | 2.5 | 5 | 5.5 | 65 | 20 | 152 | 1.8098 | 0.2292 | 0.2914 | −163 |
| 40 | 2.5 | 5 | 5.5 | 65 | 20 | 151 | 1.8084 | 0.2281 | 0.2960 | |
| 40 | 1.8 | 6 | 5.5 | 65 | 15 | 156 | 1.7736 | 0.2958 | 0.3686 | −154 |
| 40 | 1.8 | 6 | 5.5 | 65 | 15 | 156 | 1.7762 | 0.2943 | 0.3718 | |
| 40 | 2.5 | 6 | 5.5 | 65 | 20 | 149 | 1.8216 | 0.1992 | 0.2720 | −172 |
| 40 | 2.5 | 6 | 5.5 | 65 | 20 | 148 | 1.8082 | 0.2101 | 0.2813 | |
| 40 | 2.5 | 6 | 4.8 | 65 | 15 | 147 | 1.8103 | 0.2015 | 0.2762 | −156 |
| 40 | 2.5 | 6 | 4.8 | 65 | 15 | 146 | 1.7849 | 0.2169 | 0.2777 | |
| 40 | 3.0 | 6 | 5.5 | 65 | 20 | 148 | 1.8065 | 0.1846 | | |
| 40 | 3.5 | 6 | 5.5 | 65 | 20 | 141 | 1.8433 | 0.1297 | | |
| 40 | 4.0 | 6 | 5.5 | 65 | 20 | 140 | 1.8061 | 0.1132 | | |

The substrate temperature for all of the film preparation was 350 ± 50° C. The HF (high frequency) power was at 13.56 MHz; the LF (low frequency) power was at 350 kHz. The spacing between the shower head and the substrate was approximately 500 mils. The film deposition time was 8.5 seconds; and the deposition rate ranged from about 990to about 1075 Å per minute. The symbol "n" represents refractive index, and the symbol "k" represents the extinction coefficient. Sccm refers to standard cc per minute; slm refers to standard liters per minute. The reference to 150 Å and 250 Å with respect to the k value indicates the thickness of the DARC. 193.

We have achieved an increased contact angle between the DARC surface and a water-based, alkaline CAR photoresist developer by treating the surface of the DARC after formation of the DARC. We have demonstrated that treatment of a DARC film after formation with a hydrogen plasma or a helium plasma increases the contact angle between the DARC surface and a water-based photoresist developing agent. The hydrogen and helium plasma treatments of a deposited DARC film were carried out in a PRODUCER® twin PECVD chamber using a single frequency RF power source for plasma generation. Preferably, the hydrogen plasma is used for the DARC film surface treatment, as this has provided a long shelf life for the DARC coated substrate prior to application of a photoresist and has provided better uniformity of performance across a wafer substrate compared with a helium treatment, as will be discussed in more detail below.

The DARC 193 film typically used in the example embodiments described below was deposited in the PRODUCER® twin PECVD chamber of Applied Materials, Inc.

In some instances, the DARC 193 film was prepared using a single 13.56 frequency RF power source. The general process conditions for a $SiO_xH_y$:C 193 DARC film deposition using a single frequency power source were: $SH_4$ flow rate of 40 to 80 sccm, $CO_2$ flow rate of 900 to 4,000 sccm, He flow rate of 2,000 sccm to 12,000 sccm; plasma source power 100 W to 175 W; spacing between the shower head and the substrate ranged from 400 mils to 800 mils; the substrate temperature was 350° C.±50° C.; the process chamber pressure ranged between 4 Torr and 8 Torr.

In other instances, a multiple frequency, typically a dual frequency RF power source was used to generate the plasma, where each of the multiple frequency power applications was made to the same electrode. Table I, below, shows a series of process conditions and measured values representative of The nitrogen-free (N-free) dielectric anti-reflective coating $SiO_xH_y$:C was developed to reduce the poisoning interaction caused when $NO_2$ is used as a precursor during deposition of the DARC 193. However, we learned, after considerable testing, that the presence of —OH radicals, which either exist inherently in the DARC or result from $H_2O$ absorption on the DARC surface also cause photoresist poisoning of a CAR positive photoresist. Current investigation has revealed that poisoning can be eliminated by surface acidification of the DARC after deposition. The DARC surface acidification circumvents the neutralization of photo-generated H+ in the CAR by the —OH radicals inherently in the DARC. In addition, we have discovered that a more dense ARC film makes it difficult for —OH radicals to form on the DARC surface due to $H_2O$ absorption. Compressive film stress is an indication of film density, and directly correlates to resistance to $H_2O$ absorption on the DARC film surface.

It was possible to greatly improve the DARC resistance to $H_2O$ absorption by creating and maintaining a deposition process regime that makes the DARC film more dense. This dense DARC film with an acidified surface has demonstrated promising lithography performance with minimal resist poisoning, as well as excellent shelf life and $O_2$ ashing resistance. Combination of DARC film densification, DARC film surface acidification, and a DARC film surface which provides a high contact angle during development of the photoresist ensures both excellent pattern development and adhesion of the photoresist during development for 193 nm lithography, and during the patterning of 90 nm and smaller features.

For reference purposes, a PECVD nitrogen-containing DARC typically has a composition $SiO_xN_y$:H, where Si is typically about 55 atomic percent, O is about 35 atomic percent and N is about 15% or less of the DARC composition. The new N-free DARC 193 composition $SiO_xH_y$:C is such that Si ranges from about 40 atomic % to 45 atomic %, O ranges from about 40 atomic % to 51 atomic %, H ranges from about 4 atomic % to about 15 atomic %, and C ranges from about 0 atomic % to about atomic 5%, but is typically less than about 3 atomic %. The DARC 193 is produced by PECVD using $SiH_4$, an oxygen source, and an inert gas as precursors. When the oxygen source is $CO_2$, this contributes carbon to the DARC 193 film.

When the silane used as a precursor contains carbon, such as a trimethyl or tetramethyl silane, for example, the DARC 193 film contains Si ranging from about 20 atomic % to 50 atomic %, O ranges from about 10 atomic % to about 20 atomic %, H ranges from about 10 atomic % to about 50 atomic %, and C ranges from about 10 atomic % to about 50 atomic %.

When photoresist poisoning occurs, electron pairs from a basic group attract protons from the 193 nm positive-acting chemically-amplified photoresist, neutralizing the formation of an acid in irradiated areas of the photoresist, typically at the interface of the photoresist adjacent the DARC surface. The poisoning manifests itself as a bump in via structures, footing, scums, and a rough surface on a substrate.

We determined that use of multiple frequency power application during deposition of a DARC increases the density of the DARC film, as previously mentioned; this improves the film resistance to $H_2O$ absorption. As a result, the shelf life of the deposited DARC film and the maintenance of refractive index and extinction coefficient of the DARC film is improved with the use of multiple, typically dual, frequency power application during the deposition of the DARC film. By using optical measurements and FTIR, we were able to correlate film stress, which is an indicator of film density, with the increased shelf life and maintenance of refractive index and extinction coefficient for a variety of different film compositions. The detailed data is presented in the embodiment examples provided below.

However, the DARC films deposited under process conditions which produce a dense film, such as a plasma source gas flow rate of $SiH_4$ at 40 sccm, $CO_2$ at 2.5 slm, and He at 6 slm; at a pressure of 5.5 Torr, with 65 W of HF power and 20 W of LF power, for example, and not by way of limitation, exhibit a contact angle in the range of about 5 degrees. Although the photoresist poisoning problem may be avoided by the dense film, when the patterned feature size of the photoresist is 120 nm or smaller the contact angle should be about 20 degrees or higher, and when the patterned feature size of the photoresist is 90 nm and smaller, the contact angle should be about 30 degrees or higher. The contact angle of about 5 degrees which was obtained between the DARC film and the fluid developer is not adequate to ensure that the photoresist footings will not deteriorate at the DARC film surface during development of the photoresist pattern.

As discussed above, when the composition of a DARC 193 ($SiO_xH_y$:C) film does not provide an adequate contact angle, or when the developed pattern is poor, it is possible to increase the contact angle and to reduce resist poisoning by treating the surface of the DARC 193 film after deposition. We have treated various DARC 193 film surfaces with plasmas of $CO_2$, $H_2$, and He. We have also placed a capping layer of α-silicon on the DARC 193 film surface. The results achieved using these surface treatment techniques are illustrated in FIGS. 2A through 2E. The DARC 193 films which were treated were prepared using dual frequency RF power application of the kind described above.

EXAMPLE EMBODIMENTS

Example One

As a comparative example, a SiON DARC having an n (refractive index) of 1.9 and a k (extinction coefficient) of 0.3 @ 248 nm was capped with a 50 Å thick silicon oxide capping film generated from a $SiH_4/CO_2$/helium plasma using the general PECVD conditions of the kind described above for a single frequency plasma deposition process. The capped DARC exhibited a contact angle of 5.1 degrees with the water based alkaline developer used to develop the CAR, which was the SHIPLEY® UV6 photoresist. After exposure to either 230 J or 280 J of 248 nm patterning radiation, followed by development of the pattern, a photomicrograph of a top view 200 of the developed photoresist had the appearance illustrated by the schematic shown in FIG. 2A. The oxide-capped SiON DARC surface 202 was completely exposed in patterned areas after development of the photoresist, because the lines and spaces pattern which was to be developed failed due to detachment of the photoresist during development in areas 204.

Example Two

As a second comparative example, a nitrogen-free DARC 193 $SiO_xH_y$:C film having an n of 1.9 and a k of 0.3 @ 248 nm, which was surface treated with a $CO_2$ plasma for a time period of about 20 seconds, using a $CO_2$ flow rate of about 3 slm in a 200 mm PRODUCER® twin PECVD process chamber, using the single frequency plasma deposition process. The pressure was about 5 Torr, at a substrate temperature of about 350° C., at a plasma source power of about 50-100 W at 13.56 MHz, and at a shower head spacing of 450 mils from the substrate surface. The $CO_2$-treated DARC 193, exhibited a contact angle of only 3.5 degrees with respect to the photoresist water-based alkaline developer. Exposure of the CAR to either 230 J or 280 J of 248 nm patterning radiation, and development of the imaged photoresist resulted in a developed photoresist where none of the patterned areas were present. All of the developed feature areas became detached from the DARC surface and washed away on development.

Example Three

Figure 2A:
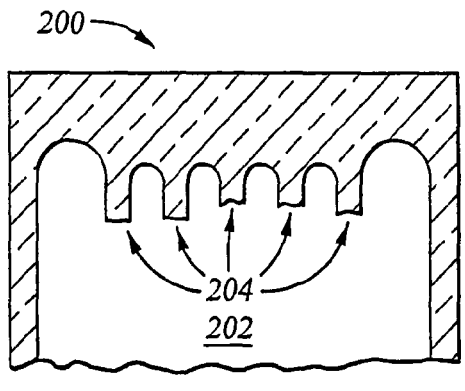
FIG. 2A shows a schematic top view 200 of an SEM image for a developed CAR on the surface of a $SiO_xN_y$ DARC, where the contact angle between the DARC and the developer for the photoresist was about 5.1 degrees.
Figure 2B:
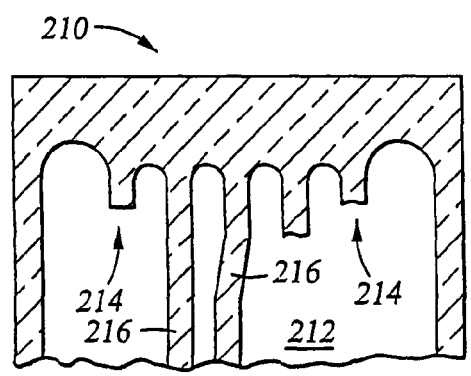
FIG. 2B shows a schematic top view 210 of an SEM image for a developed CAR on the surface of a $SiO_xH_y$ DARC, where the contact angle between the DARC and the developer for the photoresist was about 3.7 degrees.

As a third comparative example, a nitrogen-free DARC 193 $SiO_xH_y$:C film having an n of 1.9 and a k of 0.3 @ 248 nm, which was not surface treated, exhibited a contact angle of about 3.7 degrees with respect to the same developer mentioned with respect to Example Two. Exposure of the SHIPLEY® UV6 photoresist to 230 J of 248 nm patterning radiation, followed by development of the latent irradiated image in the photoresist, produced a relatively acceptable pattern. However, exposure of the CAR to is 280 J of 248 nm patterning radiation, followed by development, produced a defective pattern in the CAR of the kind illustrated in FIG. 2B. FIG. 2B is a schematic top view 210 of a photomicrograph of the patterned photoresist. The DARC 193 surface 212 was exposed in some areas where the photoresist 216 should have been present. The photoresist 216 became detached, leaving broken off areas 214 where photoresist was missing. The difference in the developed pattern with such a slight difference in the amount of energy applied during radiation of the pattern indicates that the combination of the imaging and development process is not reliable for manufacturing purposes. We needed to provide an imaging and development process which was sufficiently reliable for production.

Example Four

Figure 2C:
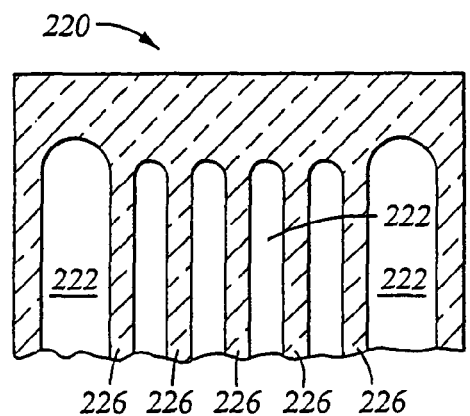
FIG. 2C shows a schematic top view 220 of an SEM image for a developed CAR on the surface of a $SiO_xH_y$ DARC, where the contact angle between the DARC and the developer for the photoresist was about 34.5 degrees.
Figure 2D:
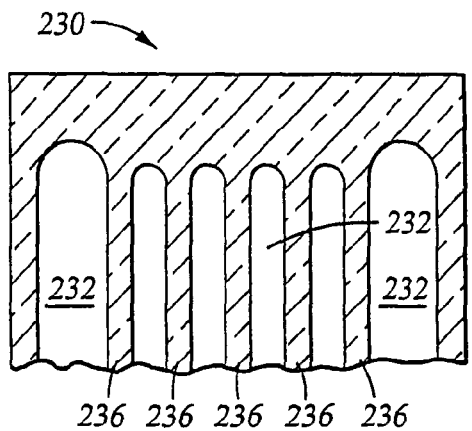
FIG. 2D shows a schematic top view 230 of an SEM image for a developed CAR on the surface of a hydrogen plasma treated $SiO_xH_y$ DARC, where the contact angle between the DARC and the developer for the photoresist was about 63 degrees.

In a first example of the invention, a DARC 193 $SiO_xH_y$:C film having an n of 1.9 and a k of 0.3 @ 248 nm, which was surface treated with a single frequency-generated hydrogen plasma for a time period of about 10 seconds, using a hydrogen flow rate of 600 sccm in the 200 mm PRODUCER® twin PECVD process chamber, at a pressure of ranging from about 2 Torr to about 10 Torr (typically about 5.5 Torr), at a substrate temperature of about 350±50° C., at a plasma source power of 300 W at 13.56 MHz, and at a shower head spacing of 450 mils from the substrate surface, exhibited a contact angle of about 63 degrees with respect to the same developer mentioned with respect to Example Three. Exposure of the photoresist to either 230 J/m$^2$ or 280 J/m$^2$ of 248 nm patterning radiation, followed by development of the image using the developer produced a very acceptable pattern of approximately 110 nm features in the CAR. The pattern produced is illustrated in FIG. 2D. FIG. 2D is a top view 230 of a photomicrograph of the patterned photoresist. Experimentation has indicated that the nitrogen-free DARC 193 with the hydrogen surface treatment has a comparable lithography window with respect to a BARC used for poly gate applications. This is because the H$_2$ treatment does not affect reflectivity as much as a capping layer of α-silicon, for example.

Example Five

In a second example of the invention, a DARC 193 SiO$_x$H$_y$:C film having an n of 1.9 and a k of 0.3 @ 248 nm, which was surface treated with a helium plasma generated using a single frequency power source, for a time period of about 10 to about 30 seconds, using a helium flow rate of 5 slm in the 200 mm PRODUCER® twin PECVD process chamber, at a pressure of ranging from about 2 Torr to about 10 Torr (typically about 5.5 Torr), at a substrate temperature of about 350±50° C., at a plasma source power of 50-100 W at 13.56 MHz, and at a shower head spacing of 450 mils from the substrate surface, exhibited a contact angle of about 32 degrees to about 40 degrees (for the 10 second and 30 second treatment periods, respectively) with respect to the same developer mentioned above. Exposure of the photoresist CAR to 230 J/m$^2$ or 280 J/m$^2$ of 248 nm patterning radiation, followed by development of the image using the developer produced an acceptable pattern of approximately 110 nm features in the CAR over the substrate surface as a whole. However, there were some areas on the substrate surface which were substandard. There is no representative Figure shown which illustrates this example.

Example Six

In a third example of the invention, a nitrogen-free DARC 193 SiO$_x$H$_y$:C film having an n of 1.9 and a k of 0.3 @ 248 nm, which was capped with a 15 Å thick α-Si coating applied by discontinuing the CO$_2$ reagent feed to the DARC 193 single frequency plasma deposition process. The α-silicon deposition time period was about 5 seconds, using a SiH$_4$ flow rate of 10 sccm and helium at a 6 slm flow rate in the 200 mm PRODUCER® twin PECVD process chamber, at a pressure of ranging from about 2 Torr to about 10 Torr (typically about 5.5 Torr), at a substrate temperature of about 350±50° C., at a plasma source power of 50 W at 13.56 MHz, and at a shower head spacing of 500 mils from the substrate surface, exhibited a contact angle of about 34.5 degrees with respect to the water-based, basic developer. Exposure of the CAR to either 230 J/m$^2$ or 280 J/m$^2$ of 193 nm patterning radiation, followed by development of the image, produced a very acceptable pattern of 90 nm features in the CAR which is illustrated in FIG. 2C. FIG. 2C is a schematic top view 230 of a photomicrograph of the patterned photoresist. The DARC 193 surface 232 was properly exposed in the developed areas, leaving the photoresist 236 present in desired areas of the approximately 110 nm feature size pattern. Although this example is for an α-silicon capping film, an α-carbon capping film is expected to provide similar results.

Example Seven

Figure 2E:
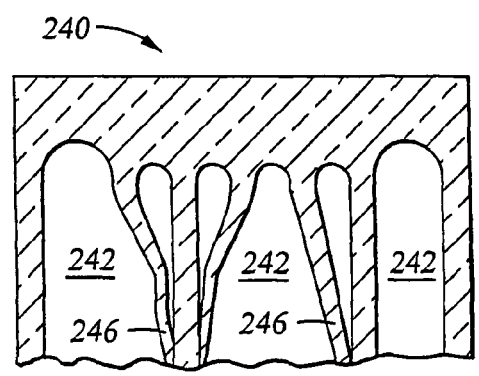
FIG. 2E shows a schematic top view 240 of an SEM image for a developed CAR on the surface of a silicon-rich, nitrogen-free DARC, where the contact angle between the DARC and the developer for the photoresist was about 3.5 degrees.

FIG. 2E illustrates a schematic top view 240 of a nitrogen-free DARC 193 SiO$_x$H$_y$:C film having an n of 1.9 and a k of 0.8 @ 248 nm. The increased k was obtained by reducing the carbon content of the film to less than about 2.0%, and increasing the S—H content of the film during deposition of the film, using the process parameters described above with respect to a nitrogen-free DARC 193 deposition. However, the increase in S—H content of the film was inadequate and did not produce a contact angle which was helpful. The contact angle obtained was 3.5 degrees, and photoresist detachment was observed during development of the photoresist. Although a 230 J/m$^2$ exposure during patterning did produce an acceptable, the 280 J/m$^2$ exposure did not. The schematic top view 240 of the developed pattern for the 280 J/m$^2$ exposure, which is illustrated in FIG. 2E, shows that, due to detachment and shifting of the location of portions of the photoresist 246 during development, the DARC 193 surface 242 did not exhibit the proper pattern.

Figure 3:
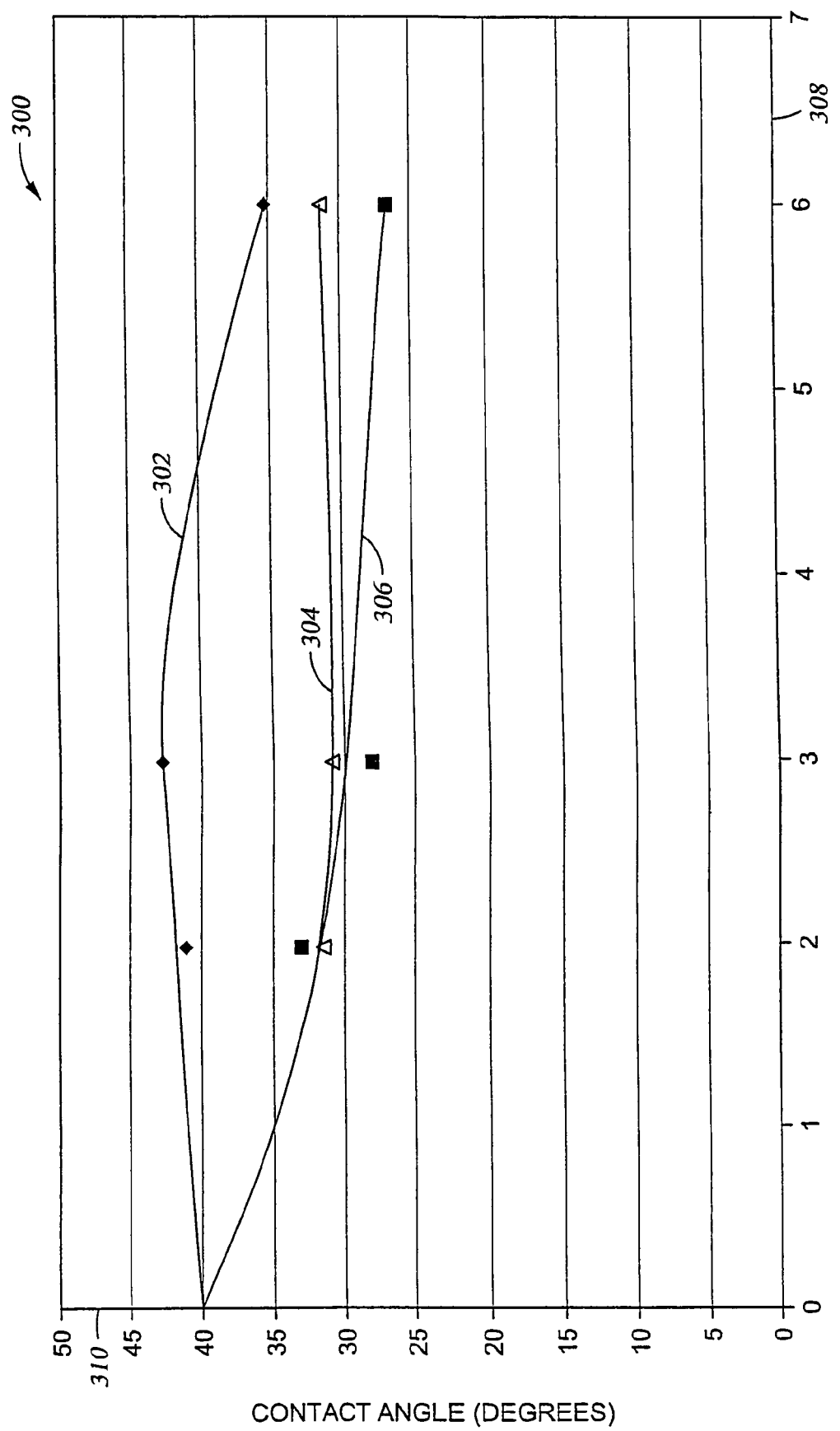
FIG. 3 is a graph showing the change in contact angle between a nitrogen-free DARC 193, $SiO_xH_y$ surface and a water-based alkaline photoresist developer, where the DARC 193 surface was treated with a helium plasma. Initially, the contact angle between the DARC surface and the developer was about 30 degrees to about 40 degrees depending on the plasma treatment time. The contact angle change is shows as a function of passing time in days, where each curve represents a different helium plasma treatment period.

FIG. 3 is a graph 300 illustrating the shelf life of the contact angle for a DARC 193 film which is contacted with an aqueous, basic developer, where the DARC 193 film surface was treated with a helium plasma to improve the contact angle. After deposition of the nitrogen-free DARC 193 SiO$_x$H$_y$:C film, the substrate was stored in air at room temperature (about 27° C.) under typical clean room conditions. The contact angle is shown on scale 310, with the days after DARC 193 formation and helium plasma treatment shown on scale 308. Curve 302 illustrates the change in contact angle for a DARC 193 film, n≈1.9, k≈0.3 @ 248 nm (a low k DARC), which was exposed to 10 seconds of helium plasma treatment. Curve 304 illustrates the change in contact angle for the DARC 193 film which was exposed to 30 seconds of helium plasma treatment. Curve 306 illustrates the change in contact angle for the DARC 193 film which was exposed to 60 seconds of helium plasma treatment. It is a surprising result that the longer treatment times caused the change in contact angle to be more rapid and that the change resulting from longer treatment times could be so drastic as to cause the contact angle to fall to about 28 degrees. For example, when the helium plasma treatment time is 60 seconds, the contact angle drops below 30 degrees within 3 days, while the 10 second treatment provided a 35 degree contact angle after 6 days.

Figure 4:
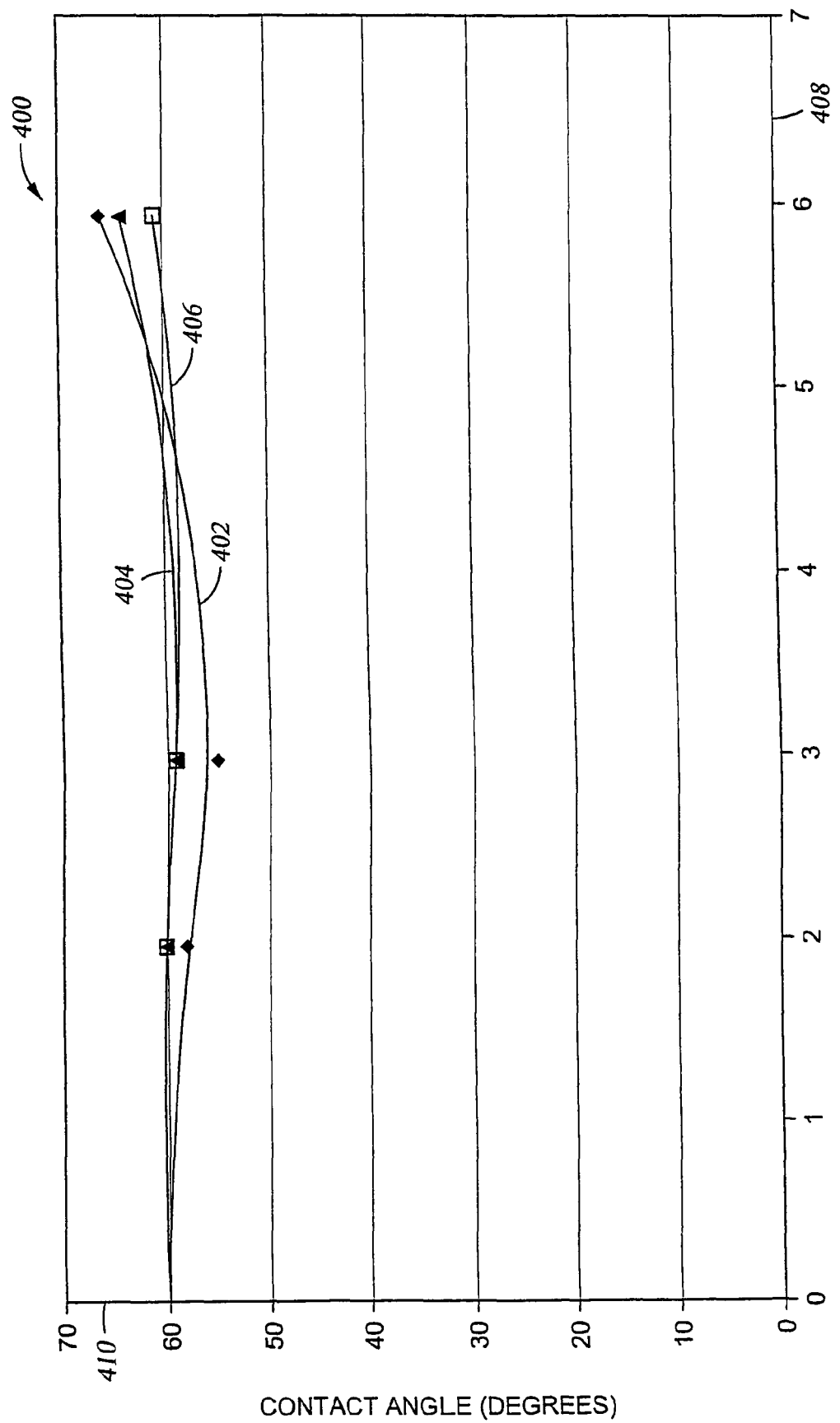
FIG. 4 is a graph showing the change in contact angle between a nitrogen-free DARC 193, $SiO_xH_y$ surface and HMDS photoresist developer, where the DARC 193 surface was treated with a hydrogen plasma. Initially, the contact angle between the DARC surface and the developer was about 60 degrees. The contact angle change is shows as a function of passing time in days, where each curve represents a different hydrogen plasma treatment period.

FIG. 4 is a graph 400 illustrating the shelf life of the contact angle for a DARC 193 film, n≈1.9, k≈0.3 @ 248 nm (a low k DARC), which is contacted with the aqueous, basic developer, where the DARC 193 film surface was treated with a hydrogen plasma and then stored in the manner described with reference to FIG. 3. The contact angle is shown on scale 410, with the days after DARC 193 formation and hydrogen plasma treatment shown on scale 408. Curve 402 illustrates the change in contact angle for the DARC 193 film which was exposed to 10 seconds of hydrogen plasma treatment. Curve 404 illustrates the change in contact angle for the DARC 193 film which was exposed to 30 seconds of hydrogen plasma treatment. Curve 406 illustrates the change in contact angle for the DARC 193 film which was exposed to 60 seconds of hydrogen plasma treatment. In the instance of a hydrogen plasma treatment, the change in contact angle is relatively small over a six day time period, with a slight increase in the contact angle toward the end of the six day time period. This may be indicative of a reaction taking place between the surface of the DARC 193 film and the hydrogen so that the hydrogen becomes a permanent part of the DARC 192 film surface. This is in contrast with the DARC 193 film treated with the helium plasma, where helium may be absorbed on the film surface rather than reacted with the surface, since the surface shows a significant decrease in contact angle over a time period.

The indication that the helium plasma treatment alters the contact angle of the DARC 193 surface in a temporary manner does not mean that the helium plasma treatment is not useful; it simply means that the DARC 193 surface must be used within a relatively short time period.

The other concern in the production of feature sizes of 120 nm or less, and in particular 90 nm or less, is that there will be photoresist poisoning even though the photoresist remains attached during development. To have proper pattern formation, it is necessary that the photoresist remain attached to the substrate during development and that photoresist poisoning, which will prevent proper pattern development, be avoided. At the time of development of the nitrogen-free DARC 193, it was anticipated that the absence of nitrogen would eliminate the poisoning of the acid-based positive CAR, as previously discussed. However, it was discovered that the presence of —OH radicals on the surface of the DARC 193 continued to create photoresist poisoning problems. —OH radicals were suspected to be present due to moisture absorption of the DARC 193 surface.

To avoid photoresist poisoning when the nitrogen-free DARC 193 $SiO_xH_y$:C film is used, we tried two different approaches. The first approach was to density the surface of the film so that $H_2O$ absorption would not occur on the film surface. The second approach was to acidify the film surface to neutralize the effect of $H_2O$ absorption.

We evaluated the differences in reaction with $O_2$ plasma and in $H_2O$ absorption on the surfaces of nitrogen-free DARC 193 $SiO_xH_y$:C films of differing atomic composition, where the films were produced using the single frequency and dual frequency PECVD deposition techniques described above. The atomic compositions of the films were adjusted so that k=0.35, or k=0.6, or k=0.95, with k values being ±0.05. We also evaluated the effect of using helium as the inert gas in the plasma source gas compared with argon as the inert gas.

The photoresist applied over the nitrogen-free DARC 193 film was TARF-6A-101, available from TOK company (Tokyo Ohka Kogyo Co. ltd.) of Kawasaki, Japan, a 193 nm radiation exposure CAR. The patterning of this film was carried out using a CANON® AS 2 radiation source. The pattern was developed using an aqueous, basic developer supplied by TOK company for use with the TARF-6A-101 photoresist.

Figure 5:
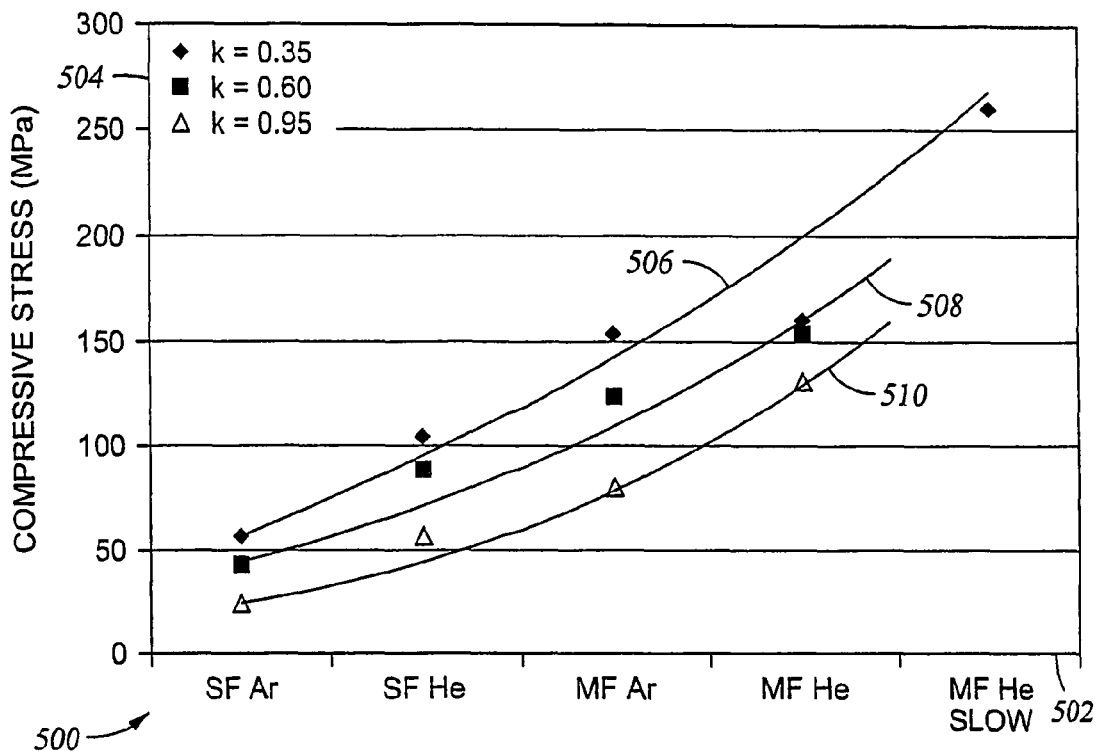
FIG. 5 is a graph 500 showing the compressive stress on scale 504 of a nitrogen-free DARC 193 film of varying atomic composition, as a function of the process conditions on scale 502, where single frequency (SF) plasma deposition was used in some instances and multiple frequency (MF) plasma deposition was used in other instances. In addition, in some instances the inert gas in the plasma source gas was argon (AR), while in some other instances the inert gas was helium (He).

FIG. 5 is a graph showing compressive stress in Mpa on scale 504, for a nitrogen-free DARC 193 $SiO_xH_y$:C film of varying atomic composition (which provides a k=0.35, k=0.6, or k=0.95, as a function of process conditions indicated on the 502 scale. SF represents a single frequency PECVD deposition of the DARC 193 film, while MF indicates a multiple (dual) frequency PECVD deposition of the DARC 193 film. Ar represents the use of argon as the inert gas in the plasma source gas, while He indicates helium as the inert gas in the plasma source gas. The compressive stress for each film composition is shown to increase when MF frequency deposition is used and when helium is used as the inert gas. In addition, when the power input to the plasma is reduced, so that the film is deposited more slowly, it is possible to get a significant increase in compressive stress of the film. Curve 506 represents a nitrogen-free DARC 193 film having an initial extinction coefficient of 0.35; Curve 508 represents the DARC 193 film having an initial extinction coefficient of 0.6; and Curve 510 represents the DARC 193 film having an initial extinction coefficient of 0.95. A higher compressive stress of the film has been correlated to a more dense film, as described below.

Figure 6:
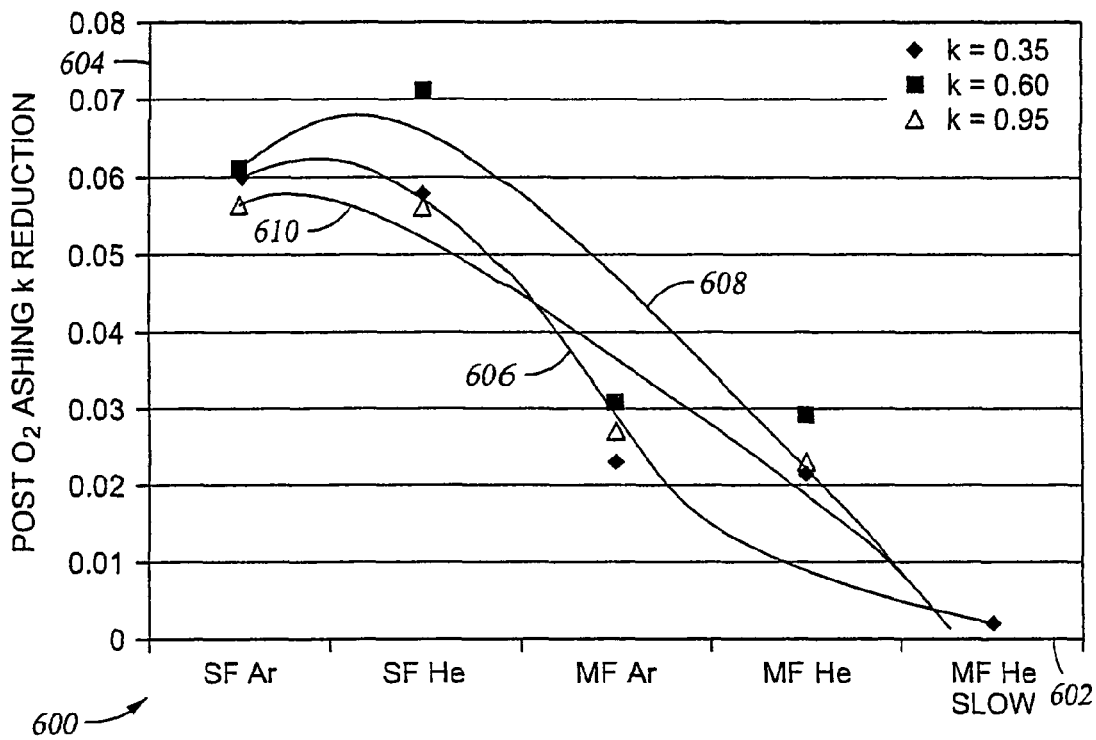
FIG. 6 is a graph 600 showing reduction in extinction coefficient, k, after $O_2$ ashing for photoresist removal, on scale 604, of a nitrogen-free DARC 193 film, where films of varying nitrogen composition were evaluated, as a function of the process conditions on scale 602, where single frequency (SF) plasma deposition was used in some instances and multiple frequency (MF) plasma deposition was used in other instances. In addition, in some instances the inert gas in the plasma source gas was argon (AR), while in some other instances the inert gas was helium (He).

FIG. 6 is a graph 600 which shows the reduction in extinction coefficient on scale 604 for the nitrogen-free DARC 193 film subsequent to $O_2$ plasma ashing for photoresist removal, as a function of process conditions specified on scale 602. Again, SF represents single frequency plasma deposition of the film, while MF indicates multiple frequency deposition. Ar represents the use of argon as the inert gas in the plasma source gas, while He represents the use of helium. A review of FIG. 6 clearly indicates that the extinction coefficient k of the nitrogen-free DARC 193 film experiences less of a reduction after the $O_2$ ashing when multiple frequency PECVD deposition of the film is carried out, when helium is used as the inert gas in the plasma source gas, and when the film deposition rate is slower. Curve 606 represents the DARC 193 film having an initial extinction coefficient of 0.35; Curve 608 represents the film having an initial extinction coefficient of 0.6, and Curve 610 represents the film having an initial extinction coefficient of 0.95. The slower reduction in extinction coefficient which occurs upon $O_2$ ashing clearly correlates with the increase in compressive strength of the film which is illustrated in FIG. 5.

Figure 7:
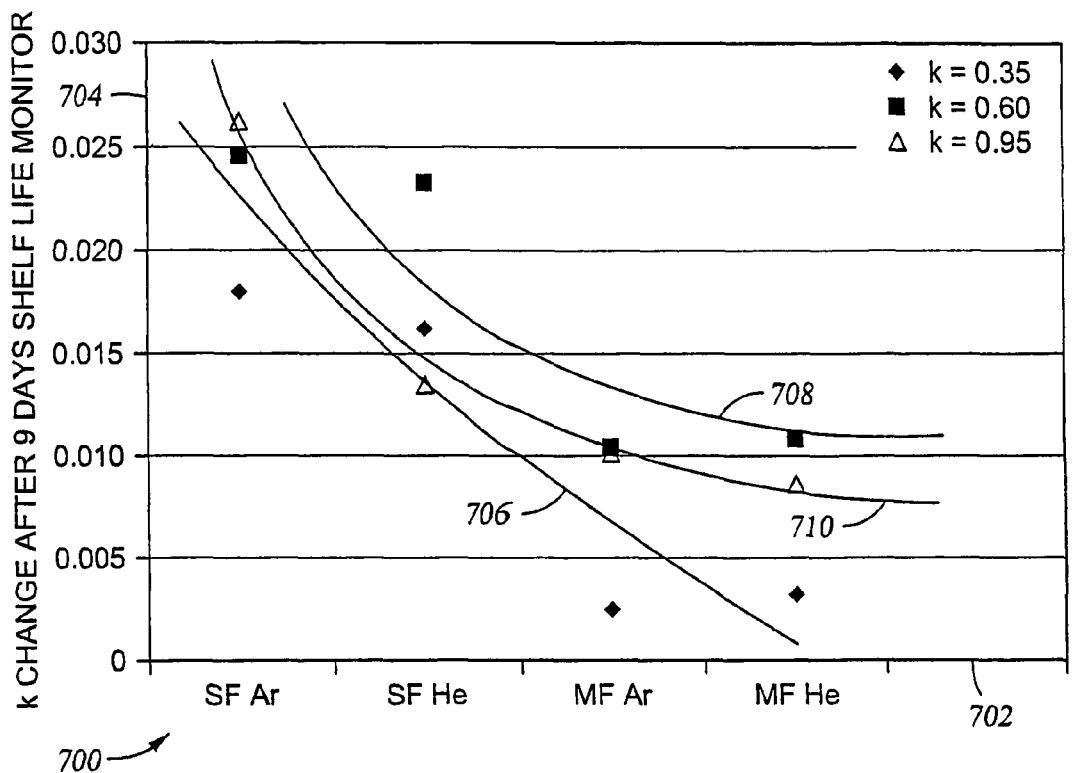
FIG. 7 is a graph 700 showing change in extinction coefficient, k, after 9 days of storage at room temperature in ambient atmosphere of a clean room, on scale 704, of a nitrogen-free DARC 193 film, where films of varying nitrogen composition were evaluated, as a function of the process conditions on scale 702, where single frequency (SF) plasma deposition was used in some instances and multiple frequency (MF) plasma deposition was used in other instances. In addition, in some instances the inert gas in the plasma source gas was argon (AR), while in some other instances the inert gas was helium (He).

FIG. 7 is a graph 700 which shows the reduction in extinction coefficient on scale 704 for the nitrogen-free DARC 193 film after 9 days of standing a room temperature in a clean room ambient, as a function of process conditions specified on scale 702. Again, SF represents single frequency plasma deposition of the film, while MF indicates multiple frequency deposition. Ar represents the use of argon as the inert gas in the plasma source gas, while He represents the use of helium. Curve 706 represents the DARC 193 film having an initial extinction coefficient of 0.35, Curve 708 represents the film having an initial extinction coefficient of 0.6, and Curve 710 represents the film having an initial extinction coefficient of 0.95. A review of FIG. 7 clearly indicates that the extinction coefficient k of the nitrogen-free DARC 193 film experiences less of a reduction after standing in the clean room when multiple frequency PECVD deposition of the film is carried out, when helium is used as the inert gas in the plasma source gas, and when the film deposition rate is slower. Although the correlation is not as good as for $O_2$ ashing, clearly the shelf life of the extinction coefficient for the nitrogen-free DARC 193 film also correlates with the increase in compressive strength of the film which is illustrated in FIG. 5.

Figure 8:
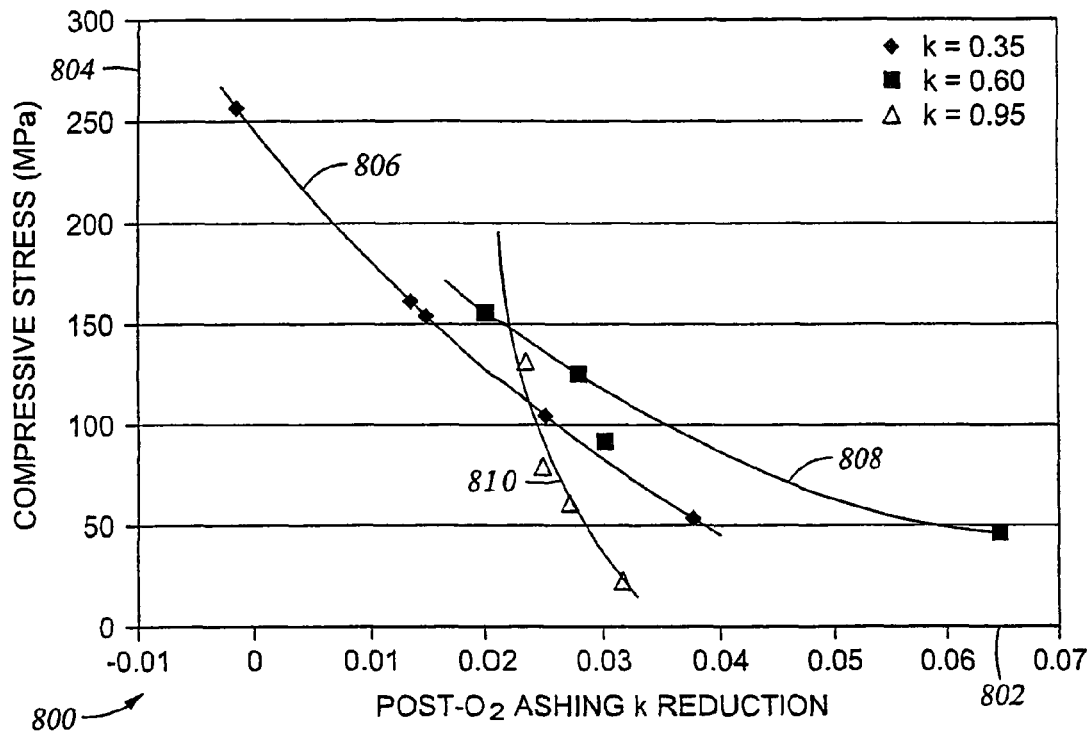
FIG. 8 is a graph 800 showing the post oxygen plasma ashing reduction in refractive index (n) on scale 802, for a nitrogen-free DARC 193 film, as a function of the compressive stress of the DARC film on scale 804. Curve 806 represents a DARC film having an extinction coefficient (k) of 0.35; Curve 808 represents a DARC film having a k of 0.6; and Curve 810 represents a DARC film having a k of 0.95. The extinction coefficient is a function of the chemical composition of the film. The thickness of each film was about 250 Å.

FIG. 8 is a graph 800 which shows the reduction in refractive index n on scale 802 for the nitrogen-free DARC 193 film as a function of the compressive stress of the film indicated on scale 804. Curve 806 represents the DARC 193 film having an initial extinction coefficient of 0.35, Curve 808 represents the film having an initial extinction coefficient of 0.6, and Curve 810 represents the film having an initial extinction coefficient of 0.95. FIG. 8 shows that a nitrogen-free DARC 193 film having a higher compressive strength initially will provide a smaller change in refractive index after $O_2$ ashing. FIG. 8 also shows that a nitrogen-free DARC 193 film having a higher extinction coefficient initially (due to atomic composition) is subject to a greater proportional reduction in magnitude after $O_2$ ashing as the initial compressive stress of the film decreases.

Figure 9:
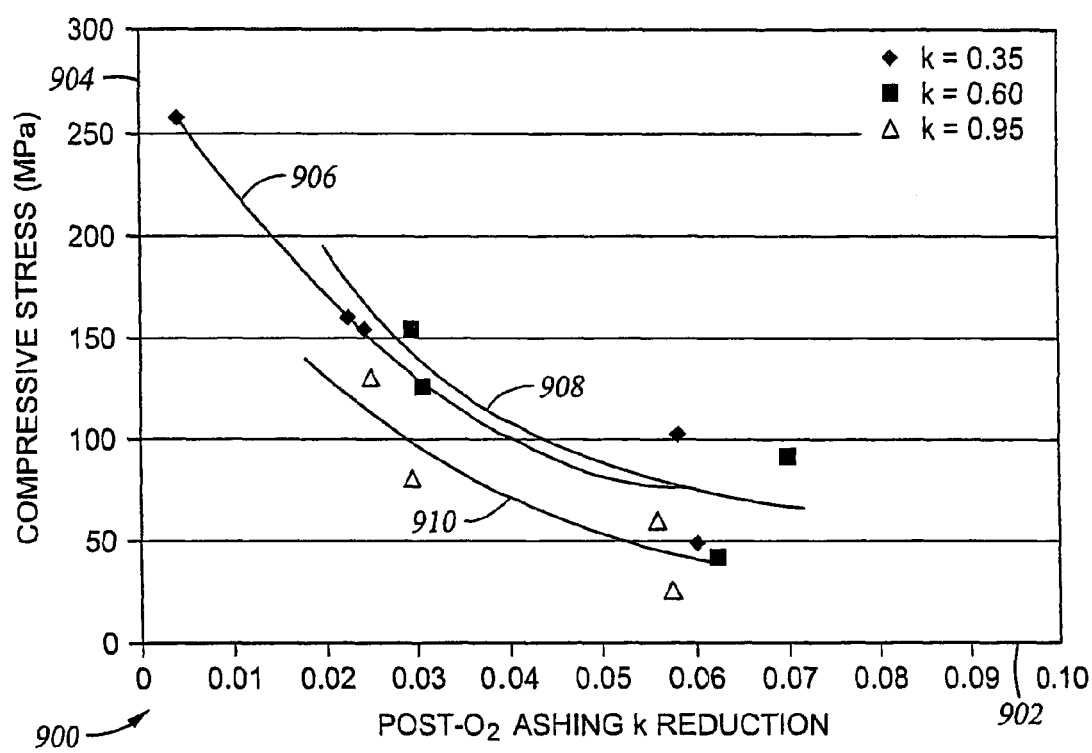
FIG. 9 is a graph 900 showing the post oxygen ashing reduction in extinction coefficient (k) on scale 902, for a nitrogen-free DARC 193 film, as a function of the compressive stress of the DARC film on scale 904. Curve 906 represents a DARC film having an initial extinction coefficient (k) of 0.35; Curve 908 represents a DARC film having an initial k of 0.6; and Curve 910 represents a DARC film having an initial k of 0.95. The thickness of each film was about 250 Å.

FIG. 9 is a graph 900 which shows the reduction in extinction coefficient k on scale 902 for the nitrogen-free DARC 193 film as a function of the compressive stress of the film indicated on scale 904. Curve 906 represents the DARC 193 film having an initial extinction coefficient of 0.35, Curve 908 represents the film having an initial extinction coefficient of 0.6, and Curve 910 represents the film having an initial extinction coefficient of 0.95. FIG. 9 shows that a nitrogen-free DARC 193 film having a higher compressive strength initially will provide a smaller change in extinction coefficient after $O_2$ ashing.

According to Fourier Transform Infrared Spectroscopy (FTIR) data with respect to the presence of an —OH absorption peak, a nitrogen-free DARC 193 film produced using single frequency PECVD which exhibits a lower compressive stress is more susceptible to moisture absorption.

No —OH absorption peak was observed for nitrogen-free DARC 193 films produced using multiple frequency PECVD. This suggests that the use of multiple frequency power input during film deposition produces a higher compressive stress film which is resistant to $H_2O$ absorption. As a result, photoresist poisoning will be reduced when DARC 193 films are produced using multiple frequency PECVD.

Cross-sectional scanning electron microscope images for photoresists patterned to approximately 90 nm feature sizes (in a lines and spaces pattern) have indicated that footing at the bottom of the photoresist after development is substantially reduced when the nitrogen-free DARC 193 film underlies the photoresist, compared with a prior art nitrogen-containing DARC film. The amount of footing is further reduced when multiple frequency PECVD deposition of the DARC 193 film is used rather than single frequency PECVD deposition. Use of helium as the inert gas in the multiple frequency PECVD deposition of the film reduces the footing even more. Finally, the least footing observed when a slower deposition rate for the film is combined with the multiple frequency/helium PECVD deposition.

The above described exemplary embodiments are not intended to limit the scope of the present invention, as one skilled in the art can, in view of the present disclosure expand such embodiments to correspond with the subject matter of the invention claimed below.

We claim:

1. A method of reducing a risk of undercutting a footing at a base of a photoresist in contact with an underlying substrate surface during development of a photoresist pattern using a fluid developer, comprising: providing the underlying substrate with a substrate surface composition directly underlying said photoresist and said fluid developer used to develop a patterned image in said photoresist which work in combination with each other so that said underlying substrate surface composition forms a contact angle of about 20 degrees or greater with said fluid developer used to develop said pattern in said photoresist.

2. A method in accordance with claim 1, wherein said photoresist pattern contains features which are less than about 120 nm in size.

3. A method in accordance with claim 2, wherein said photoresist pattern contains features which are less than about 90 nm in size.

4. A method in accordance with claim 3, wherein said contact angle formed between said underlying substrate and said developer used to develop said patterned image in said photoresist is about 30 degrees or greater.

5. A method in accordance with claim 1, wherein said providing of said surface composition of said underlying substrate is accomplished by depositing a film over the surface of the substrate.

6. A method in accordance with claim 5, wherein said depositing of said film is accomplished using plasma enhanced CVD.

7. A method in accordance with claim 6, wherein said depositing film is a DARC.

8. A method in accordance with claim 7, wherein an amount of a Group IV element present in said DARC is controlled, whereby said contact angle is controlled.

9. A method in accordance with claim 8, wherein said Group IV element is carbon.

10. A method in accordance with claim 8, wherein said Group IV element is silicon.

11. A method in accordance with claim 8, wherein said Group IV element is germanium.

12. A method in accordance with claim 8, wherein said DARC is an inorganic DARC.

13. A method in accordance with claim 6, or claim 7, or claim 8, wherein said film deposition employs a power input which includes the use of a plurality of frequencies.

14. A method in accordance with claim 13, wherein said power input includes use of a plurality of RF power inputs.

15. A method in accordance with claim 13, wherein said power input includes the use of both microwave and RF power inputs.

16. A method in accordance with claim 5, wherein a capping layer is deposited over a DARC present on said substrate.

17. A method in accordance with claim 16, wherein said capping layer is deposited using plasma enhanced CVD.

18. A method in accordance with claim 16 or claim 17, wherein said capping layer is silicon-containing.

19. A method in accordance with claim 18, wherein said silicon-containing capping layer is α-silicon.

20. A method in accordance with claim 16 or claim 17, wherein said capping layer is essentially α-carbon.

21. A method in accordance with claim 1, wherein providing of said surface composition of said underlying substrate is accomplished by treating said surface with a plasma to remove OH groups present on said surface when said developer is a water-based developer.

22. A method in accordance with claim 21, wherein said surface being treated is a DARC.

23. A method in accordance with claim 22, wherein said plasma is a hydrogen-comprising plasma which makes hydrogen species available to react with said DARC surface.

24. A method in accordance with claim 23, wherein said plasma is a hydrogen plasma.

25. A method in accordance with claim 1, or claim 8, or claim 21, or claim 16, wherein said fluid developer is a water-based developer.

26. A method in accordance with claim 25, wherein said fluid developer has the property of being basic.

27. A method in accordance with claim 1, wherein said contact angle ranges from about 35 degrees to about 90 degrees.

* * * * *